(12) United States Patent
Warschauer (10) Patent No.: US 10,714,309 B1
(45) Date of Patent: Jul. 14, 2020

(54) USING IMAGES FROM SECONDARY MICROSCOPE DETECTORS TO AUTOMATICALLY GENERATE LABELED IMAGES FROM PRIMARY MICROSCOPE DETECTORS

(71) Applicant: FEI Company, Hillsboro, OR (US)

(72) Inventor: Reinier Louis Warschauer, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/375,537

(22) Filed: Apr. 4, 2019

(51) Int. Cl.
*H01J 37/28* (2006.01)
*H01J 37/22* (2006.01)
*H01J 37/244* (2006.01)
*H01J 37/26* (2006.01)

(52) U.S. Cl.
CPC .............. *H01J 37/28* (2013.01); *H01J 37/22* (2013.01); *H01J 37/244* (2013.01); *H01J 37/261* (2013.01)

(58) Field of Classification Search
CPC .......... H01J 37/28; H01J 37/22; H01J 37/244; H01J 37/261
USPC ........................ 250/306, 307, 309, 310, 311
See application file for complete search history.

(56) References Cited

U.S. PATENT DOCUMENTS

| | | | |
|---|---|---|---|
| 2004/0108459 A1* | 6/2004 | Furukawa | G01N 23/2251 250/311 |
| 2015/0371815 A1* | 12/2015 | Potocek | G02B 21/0048 250/307 |
| 2017/0200524 A1* | 7/2017 | Adler | G21K 7/00 |
| 2018/0240641 A1* | 8/2018 | Mikami | H01J 37/222 |
| 2019/0287759 A1* | 9/2019 | Own | H01J 37/28 |

* cited by examiner

*Primary Examiner* — Nicole M Ippolito (57) ABSTRACT

Methods and systems for generating labeled images from a microscope detector by leveraging detector data from a different microscope detector of a different modality include applying a focused charged beam to a sample, using a first microscope detector to detect emissions resultant from the focused charged beam being incident on the sample, and then using detector data from the first microscope detector to automatically generate a first labeled image. Automatically generating the first labeled image includes determining composition information about portions of the sample based on the detector data, and then automatically labeling regions of the first image associated with the portions of the sample with corresponding composition information. A second image of the sample is generated using detector data from a second microscope detector system of a different modality, and then the first labeled image is used to automatically label regions of the second image with corresponding composition information.

20 Claims, 6 Drawing Sheets

USING IMAGES FROM SECONDARY MICROSCOPE DETECTORS TO AUTOMATICALLY GENERATE LABELED IMAGES FROM PRIMARY MICROSCOPE DETECTORS

BACKGROUND OF THE INVENTION

Deep learning algorithms are starting to be used to automatically analyze, label, and/or correct abnormalities in images obtained with electron microscopes (EM). Traditionally, these tasks require an expert operator to individually assess the electron microscopy images. This traditional operator-based processes can take huge amounts of time (e.g., multiple hours, weeks, and/or months) to identify defects in electron microscopy images. Deep learning has been shown to drastically speed up this process.

However, before deep learning can be used to analyze, label, and/or correct abnormalities in electron microscopy images, deep learning algorithms must first be trained. To perform this training, training sets of labeled EM images must first be acquired. While EM imaging systems are able to obtain high resolution images of tiny regions of a sample, EM systems are unable to acquire composition information about the sample. Therefore, generating such a training set of labeled EM images requires an expert operator to spend hours to mark each pixel that contains a different material based on a different contrast level in the image. For example, an individual scanning EM image of a semiconductor with a resolution image of 1K×1K pixels can take 4 hours to segment. Accordingly, it is desired to have a more efficient process for generating training sets of labeled EM images

SUMMARY OF THE INVENTION

Methods and systems for generating labeled images from a microscope detector by leveraging detector data from a different microscope detector of a different modality according to the present disclosure include applying a focused charged beam to a sample, using a first microscope detector system of a first modality to detect emissions resultant from the focused charged beam being incident on the sample, generating first detector data of the first modality, and then using the first detector data to automatically generate a first labeled image. Automatically generating the first labeled image includes generating a first image of the sample based on the first detector data, determining composition information about a portion of the sample based on the first detector data, and then automatically labeling a region of the first image that is associated with the portion of the sample with the composition information.

The methods and systems further include using a second microscope detector system of a second modality (that is different from the first modality) to detect emissions resultant from the focused charged beam being incident on the sample, generating a second image of the sample using second detector data from the second microscope detector system, and then leveraging the first labeled image to automatically label a region of the second image associated with the portion of the sample with the composition information.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicates similar or identical items.

Like reference numerals refer to corresponding parts throughout the several views of the drawings.

DETAILED DESCRIPTION OF EMBODIMENTS

Methods and systems for generating labeled images from a microscope detector by leveraging detector data from a different microscope detector of a different modality are disclosed. More specifically, the disclosure includes methods and systems for generating labeled electron/charged particle microscope images of a sample by utilizing detector systems of a different modality to generate labeled images of the sample, and then utilizing these labeled images to automatically label the images generated by the electron/charged particle microscope. In this way, the disclosed systems and methods automate the process of generating labeled electron microscopy images. This in turn greatly expedites the process of generating training sets for training a deep learning and/or neural network to analyze, label, and/or correct abnormalities in images obtained with electron microscopes (EM) and/or charged particle microscopes.

Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

Figure 1:
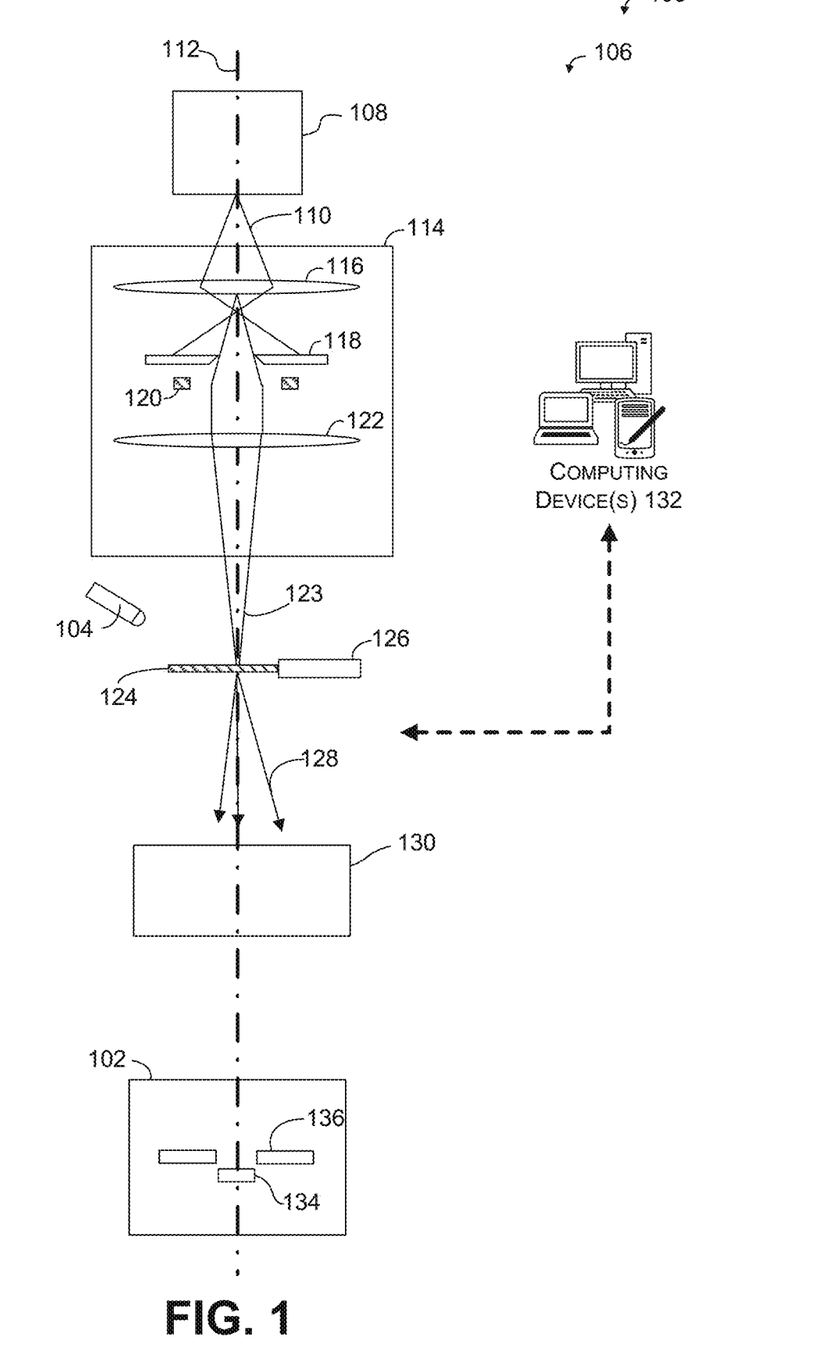
FIG. 1 illustrates example scanning transmission electron microscope setups for generating labeled images from a first microscope detector system by leveraging detector data from a second microscope detector system of a different modality.
Figure 2:
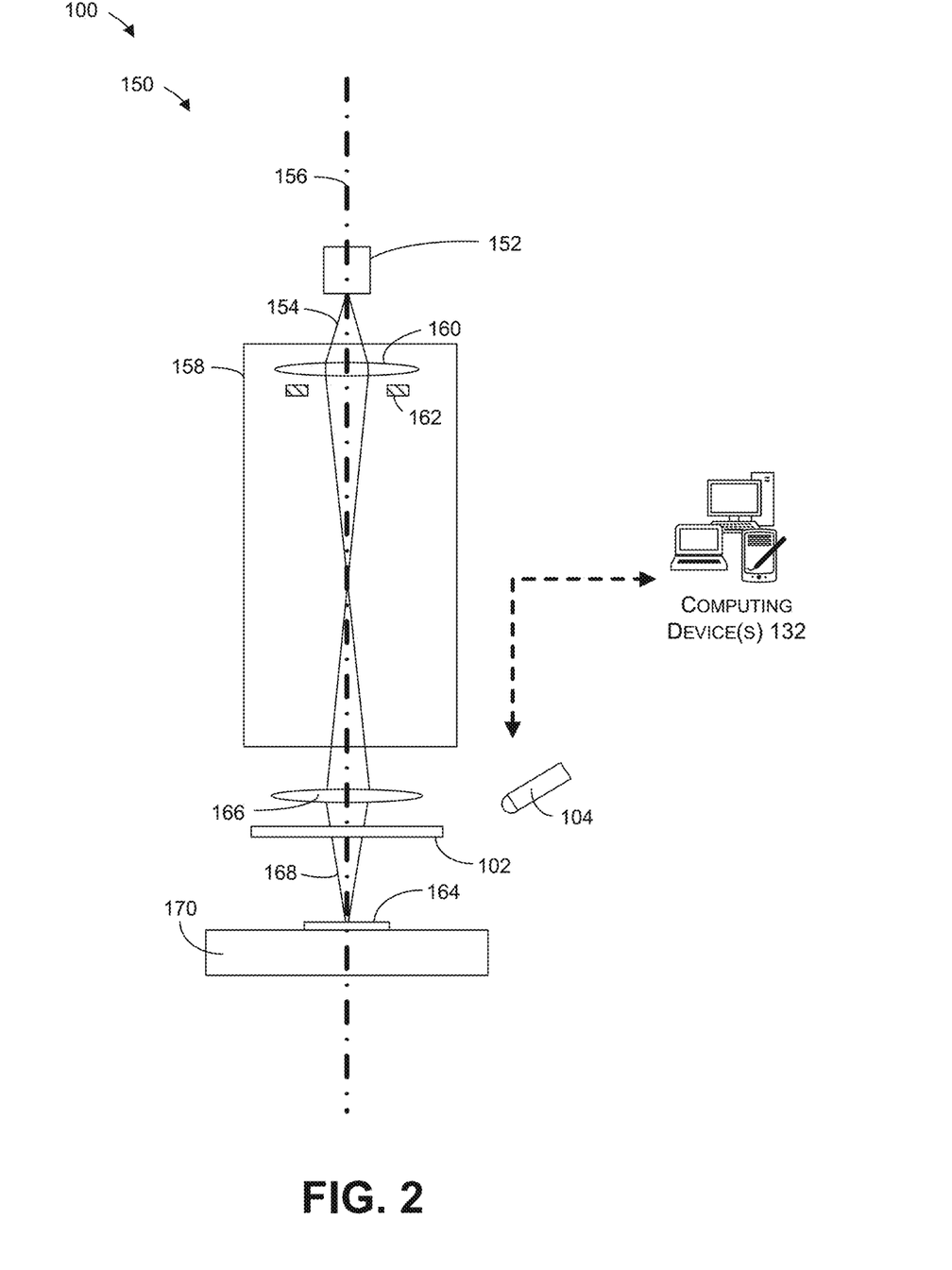
FIG. 2 illustrates example scanning electron microscope setups for generating labeled images from a first microscope detector system by leveraging detector data from a second microscope detector system of a different modality.

FIGS. 1 and 2 are illustrations of example EM and/or charged particle microscope setup(s) 100 for generating labeled images from a first microscope detector system 102 by leveraging detector data from a second microscope detector system 104 of a different modality. The example EM and/or charged particle microscope setup(s) 100 may be or include one or more different types of EM and/or charged particle microscopes, such as, but not limited to, a scanning electron microscope (SEM), a scanning transmission electron microscope (STEM), a transmission electron microscope (TEM), a charged particle microscope (CPM), dual beam microscopy system, etc.

FIG. 1 shows the example EM and/or charged particle microscope setup(s) 100 as being a STEM system 106 for generating labeled images from a first microscope detector system 102 by leveraging detector data from a second microscope detector system 104 of a different modality. However, a person having skill in the art would understand from FIG. 1 how the methods and system of the present disclosure would be embodied with other types of EM and/or charged particle microscopes. The STEM system 106 includes an electron source 108 that emits electron beam 110 along an emission axis 112, towards a focusing column 114. In some embodiments, the focusing column 114 may include one or more of a condenser lens 116, aperture 118, scan coils 120, and upper objective lens 122. The focusing column 114 focuses electrons from electron source 108 into a small spot on sample 124. Different locations of the sample may be scanned by adjusting the electron beam 123 direction via the scan coils 120. For example, by operating scan coils 120, electron beam 123 may be shifted focus onto different locations of sample 124. The sample 124 may be thin enough to not impede transmission of most of the electrons in the electron beam 123.

The sample 124 may be held by a sample holder 126. Electrons 128 passing through sample 124 may enter projector 130. In one embodiment, the projector 130 may be a separate part from the focusing column 114. In another embodiment, the projector 130 may be an extension of the lens field from a lens in focusing column 114. The projector 130 may be adjusted by a computing device 132 so that direct electrons 128 passed through the sample 124, impinge on the first microscope detector system 102. The first microscope detector system 102 is the primary microscope detector system for the EM and/or charged particle microscope setup(s) 100 and is configured to acquire highly detailed monochrome images of the sample 124. However, primary microscope detectors are unable to obtain additional information about the sample 124, such as compositional information. Accordingly, in order to obtain labeled images from the primary microscope detector system, the images acquired via the primary microscope detector must be individually segmented and/or labeled.

In FIG. 1, the first microscope detector system 102 is illustrated as being a disk-shaped bright field detector 134. In some embodiments, the first microscope detector system 102 may include one or more other detectors, e.g., a dark field detector. In such embodiments, EM and/or charged particle microscope setup(s) 100 may simultaneously detect signals from one or more of the bright field detector 134 and the dark field detector 136. Alternatively, or in addition, the first microscope detector system 102 may include a scanning electron microscope detector system, a focused ion beam detector system, a scanning electron microscope secondary electron detector system, a focused ion beam secondary electron detector system, and an optical microscope detector system.

FIG. 1 further illustrates the example EM and/or charged particle microscope setup(s) 100 as including a second microscope detector system 104 of a different modality than the first microscope detector system 102. For example, FIG. 1 illustrates the second microscope detector system 104 as being a dispersion X-ray detector. In other embodiments, the second microscope detector system 104 may correspond to one or more of a high angle dark field detector system, a dispersion x-ray detector system, a back scatter detector system, an electron energy loss spectroscopy detector system, a secondary ion detector system, and a secondary ion mass spectroscopy detector system. Signals from the first microscope detector system 102 and the second microscope detector system 104 detectors may be amplified and sent to the computing device(s) 132.

FIG. 2 shows example EM and/or charged particle microscope setup(s) 100 as being a scanning electron microscope with energy dispersive X-ray spectroscopy (SEM/EDX) system 150 for generating labeled images from a first microscope detector system 102 by leveraging detector data from a second microscope detector system 104 of a different modality.

The SEM/EDX system 150 includes an electron source 152 that emits electron beam 154 along an emission axis 156, toward a particle-optical column 158. In some embodiments, the particle-optical column 158 may include one or more of a compound lens system 160 and scan coils 162. The compound lens system 160 may be configured to modify the electron beam 154 so that it is focused onto a sample 164 by lens system 166. The incident portion of the electron beam 168 may scan over sample 164 by operating the scan coils 162. The sample 164 may be held by sample stage 170.

The SEM/EDX system 150 includes multiple detectors for detecting various emissions from sample 164 in response to the irradiation of incident beam 168. The first microscope detector system 102 may detect electrons, such as the backscattered and/or secondary electrons emitted from sample 164. In one example, the first microscope detector system 102 may be a segmented electron detector. The second microscope detector system 104 may detect the X-rays emitted from the sample 164. For example, second microscope detector system 104 may be a multi-channel photon-counting EDX detector. Signals from the first microscope detector system 102 and the second microscope detector system 104 detectors may be amplified and sent to computing device 132.

Additionally, FIGS. 1 and 2 illustrate each of the first microscope detector system 102 and the second microscope detector system 104 as being components of a single microscope/detector system. However, according to the present disclosure the second microscope detector system 104 may be part of a separate microscope/detector system. For example, the first microscope detector system 102 can be a detection component of a SEM system, while the second microscope detector system 104 can be a detection component of an X-ray fluorescence (XRF) spectrometer. In such an embodiment, a user may acquire a first image of the sample using the SEM system, and then acquire a second image of the sample using the XRF spectrometer.

Each of FIGS. 1 and 2 show example EM and/or charged particle microscope setup(s) 100 as including the computing device(s) 132 executable to generate labeled images from a first microscope detector system 102 by leveraging detector data from a second microscope detector system 104 of a different modality. The computing device(s) 132 may be a component of the example EM and/or charged particle microscope setup(s) 100 and may be in communication with the example EM and/or charged particle microscope setup(s) 100 via a network communication interface, or a combination thereof. For example, an example EM and/or charged particle microscope setup 100 may include a computing device 132 that is a component portion of the example EM and/or charged particle microscope setup 100, which acts as a controller that drives the operation of the example EM and/or charged particle microscope setup 100 (e.g., adjust the scanning location on the sample 124/164 by operating the scan coils 120/162, adjust the profile of the incident beam 123/168 by adjusting one or more apertures and/or lens, adjust the sample orientation relative to the incident beam 123/168 by adjusting the sample holder 126/170, etc.).

The computing device(s) 132 are executable to automatically generate a first image of the sample 124/164 based on the detector data received from the first microscope detector system 102. For example, in the system of FIG. 1, the computing device(s) 132 are configured to receive the detector data generated by the bright field detector 134, generate an image of the sample 124 based on the detector data from the bright field detector 134. In such an embodiment, the bright field detector 134 detects electrons 128 transmitted through a portion of the sample 124, and the computing device(s) 132 select a color/gradient value associated with the resultant detector data and then causes one or more pixels of the first image that are associated with the portion of the sample 124 to have the color/gradient value.

According to the present disclosure, the computing device(s) 132 are further executable to automatically generate a labeled second image of the sample 124/164 based on the detector data received from the second microscope detector system 104. The labeled second image is an image of the sample 124/164 that includes compositional information of portions of the sample depicted in the image. For example, in the system of FIG. 1, the computing device(s) 132 are configured to receive the detector data generated by the dispersion X-ray detector, generate an image of the sample 124 based on the detector data from the dispersion X-ray detector. This can include the second detector system 104 detecting X-rays that are emitted from a portion the sample 124, selecting a color/gradient value associated with the detector data associated with a portion of the sample 124, and then causing one or more pixels of the second image that are associated with the portion of the sample 124 to have the color/gradient value. The computing device 132 is also configured to label the second image based on the detector data received from the second microscope detector system 104. For example, in the system of FIG. 1, when the second detector system 104 detects the X-rays emitted from a portion the sample 124, the computing device(s) 132 perform X-ray spectroscopy analysis on the resultant detector data to determine compositional information of the portion of the sample 124 (e.g., atomic composition). In this way, as the electron beam 110 is translated to irradiate individual portions of the sample 124, the computing device(s) 132 determine both a color/gradient value and compositional information for each portion of the sample 124. This determined information can then be accumulated to form the labeled second image.

The computing device(s) 132 are further executable to automatically label the first image based on the labeled second image. For example, for a region of the second image that depicts a portion of the sample 124/164, the computing device(s) 132 can identify the region of the first image that depicts the same portion of the sample 124/164, and then label that region of the first image with the compositional information from the labeled second image. For example, the computing device 132(*s*) may identify one or more pixels of the first image that correspond to one or more pixels in the second image, and then label the one or more pixels of the first image with the information indicated in the label associated with the one or more pixels of the second image. The computing device(s) 132 can repeat this process to label additional regions and/or the entire first image.

Figure 3:
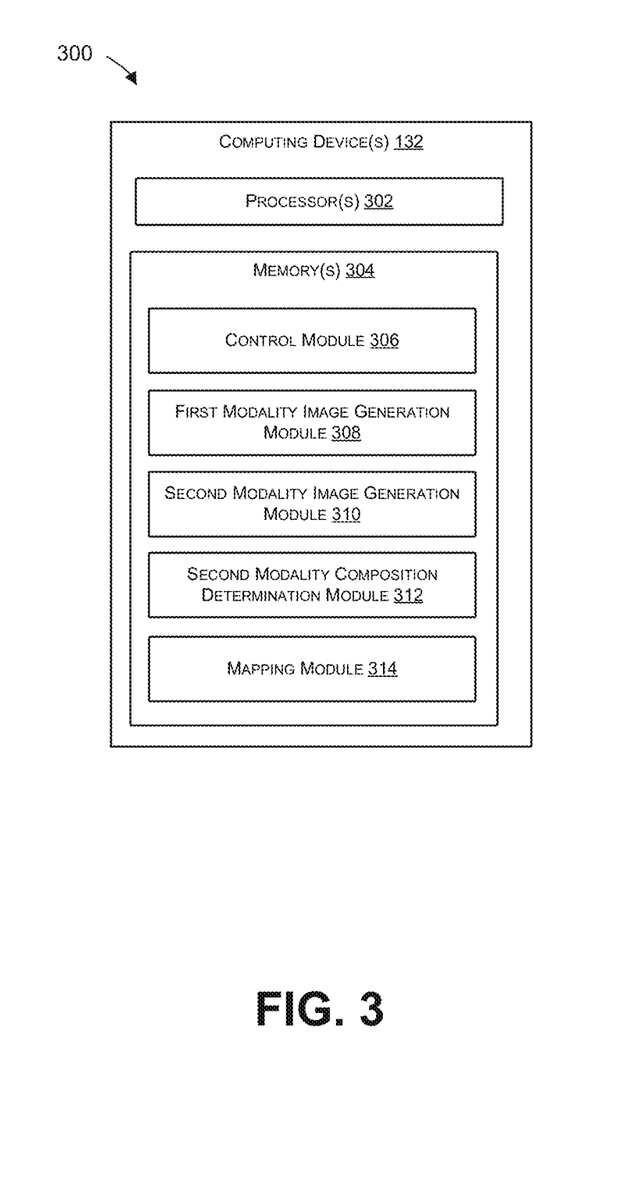
FIG. 3 schematically depicts a computing architecture for automatically generating labeled images from a first microscope detector system by leveraging detector data from a second microscope detector system of a different modality.

FIG. 3 depicts a schematic diagram illustrating computing architecture 300 of an example computing device 132 executable to automatically generate labeled images from a first microscope detector system 102 by leveraging detector data from a second microscope detector system 104 of a different modality. For instance, FIG. 3 illustrates additional details of hardware and software components that can be used to implement the techniques described in the present disclosure. In the example computing architecture 300, the computing device 132 includes one or more processors 302 and memory 304 communicatively coupled to the one or more processors 130.

The example computing architecture 300 can include control module 306, a first modality image generation module 308, a second modality image generation module 310, a second modality composition determination module 312, and a mapping module 314 stored in the memory 304. As used herein, the term "module" is intended to represent example divisions of executable instructions for purposes of discussion, and is not intended to represent any type of requirement or required method, manner or organization. Accordingly, while various "modules" are described, their functionality and/or similar functionality could be arranged differently (e.g., combined into a fewer number of modules, broken into a larger number of modules, etc.). Further, while certain functions and modules are described herein as being implemented by software and/or firmware executable on a processor, in other instances, any or all of modules can be implemented in whole or in part by hardware (e.g., a specialized processing unit, etc.) to execute the described functions. In various implementations, the modules described herein in association with the example computing architecture 300 can be executed across multiple devices.

The control module 306 can be executable by the processors 302 to act as a controller that drives the operation of the example EM and/or charged particle microscope setup 100. For example, the control module 306 may operate the scan coils 120/162 to adjust the scanning location on the sample 124/164, adjust one or more apertures and/or lenses to adjust the profile of the incident beam 123/168, and/or adjust the sample holder 126/170 to adjust the sample orientation relative to the incident beam 123/168 by adjusting.

The first modality image generation module 308 can be executable by the processors 302 to automatically generate a first image of the sample 124/164 based on the detector data received from the first microscope detector system 102. That is, the first modality image generation module 308 is configured to select a color/gradient value for individual portions (i.e., pixels) of the first image of the sample based on the detector data received from first microscope detector system 102 for the corresponding of portions of the sample.

The second modality image generation module 310 can be executable by the processors 302 to automatically generate a second image of the sample 124/164 based on the detector data received from the second microscope detector system 104. That is, the second modality image generation module 310 is configured to select a color/gradient value for individual portions (i.e., pixels) of the first image of the sample based on the detector data received from first microscope detector system 104 for the corresponding of portions of the sample.

The second modality composition determination module 312 can be executable by the processors 302 to generate determine composition information about one or more portions of the sample based on the detector data received from the second microscope detector system 104. For example, where the second microscope detector system 104 is a dispersion X-ray detector, the second modality composition determination module 312 may perform X-ray spectroscopy analysis on the resultant detector data to determine compositional information of the portion of the sample 124 (e.g., atomic composition). In some embodiments, the second modality composition determination module 312 is further configured to label the second image with the compositional information. For example, where the second modality composition determination module 312 determines that detector data associated with a portion of the sample is composed of silicon molecules, the second modality composition determination module 312 may label a portion of the second image that depicts the portion of the sample as being composed of silicon. In various embodiments, labeling the second image may include tagging a portion of the first image, adding the compositional information to metadata associated with a portion of the image, adding the compositional information to a data structure (i.e., table, file, etc.) for the first image, or a combination thereof.

The mapping module 314 can be executable by the processors 302 to automatically label the first image based on the labeled second image. For example, for a region of the second image that depicts a portion of the sample 124/164, the mapping module 314 can identify the region of the first image that depicts the same portion of the sample 124/164, and then label that region of the first image with the compositional information from the labeled second image. For example, the mapping module 314 may identify that one or more pixels of the first image correspond to one or more pixels in the second image, and then label the one or more pixels of the first image with the compositional information labeled in association with the one or more pixels of the second image. The mapping module 314 can repeat this process to label additional regions and/or the entire first image.

In some embodiments, the mapping module 314 may identify the one or more pixels/regions of the first image that correspond to one or more pixels/regions in the second image based on a pixel mapping. For example, the memory 304 may store a pixel mapping that describes relationships between the pixels/regions of images generated from the first microscope detector system 102 and the images generated from the second microscope detector system 104. The pixel mapping may be determined by the mapping module 314 based on prior image comparisons. For example, the pixel mapping may be generated by the mapping module 314 using a machine learning algorithm that is trained using a training set of images generated by the first microscope detector system 102 and the second microscope detector system 104. For each image in the training set that is generated using the first microscope detector system 102 the training set also includes a corresponding image of a same sample generated using the second microscope detector system 104.

Alternatively, the mapping module 314 may identify the one or more pixels/regions of the first image that correspond to one or more pixels/regions in the second image based on the characteristics of the images. For example, the mapping module 314 may be executable to identify characteristics (i.e., an edge, a line, a shape, a contrast change, proximity to the edge, proximity to the line, proximity to the shape, and proximity to the contrast change, etc.) of a region of the first image, and then identify a region of the second image that has similar characteristics. In some embodiments, when identifying the one or more pixels/regions of the first image that correspond to one or more pixels/regions in the second image the mapping module 314 may account for distortion in one or more of the first microscope detector system and the second microscope detector system 104.

Those skilled in the art will appreciate that the computing architecture 300 is merely illustrative and is not intended to limit the scope of the present disclosure. In particular, the computing system and devices may include any combination of hardware or software that can perform the indicated functions, including computers, network devices, internet appliances, PDAs, wireless phones, controllers, oscilloscopes, amplifiers, etc. The computing architecture 300 may also be connected to other devices that are not illustrated, or instead may operate as a stand-alone system. In addition, the functionality provided by the illustrated components may in some implementations be combined in fewer components or distributed in additional components. Similarly, in some implementations, the functionality of some of the illustrated components may not be provided and/or other additional functionality may be available.

The one or more processors 302 may be configured to execute instructions, applications, or programs stored in the memories 304. In some examples, the one or more processors 302 may include hardware processors that include, without limitation, a hardware central processing unit (CPU), a graphics processing unit (GPU), and so on. While in many instances the techniques are described herein as being performed by the one or more processors 302, in some instances the techniques may be implemented by one or more hardware logic components, such as a field programmable gate array (FPGA), a complex programmable logic device (CPLD), an application specific integrated circuit (ASIC), a system-on-chip (SoC), or a combination thereof.

The memories 304 are examples of computer-readable media. Computer-readable media may include two types of computer-readable media, namely computer storage media and communication media. Computer storage media may include volatile and non-volatile, removable, and non-removable media implemented in any method or technology for storage of information, such as computer readable instructions, data structures, program modules, or other data. Computer storage media includes, but is not limited to, random access memory (RAM), read-only memory (ROM), erasable programmable read only memory (EEPROM), flash memory or other memory technology, compact disc read-only memory (CD-ROM), digital versatile disk (DVD), or other optical storage, magnetic cassettes, magnetic tape, magnetic disk storage or other magnetic storage devices, or any other non-transmission medium that may be used to store the desired information and which may be accessed by a computing device. In general, computer storage media may include computer executable instructions that, when executed by one or more processing units, cause various functions and/or operations described herein to be performed. In contrast, communication media embodies computer-readable instructions, data structures, program modules, or other data in a modulated data signal, such as a carrier wave, or other transmission mechanism. As defined herein, computer storage media does not include communication media.

Those skilled in the art will also appreciate that, while various items are illustrated as being stored in memory or storage while being used, these items or portions of them may be transferred between memory and other storage devices for purposes of memory management and data integrity. Alternatively, in other implementations, some or all of the software components may execute in memory on another device and communicate with the illustrated computing architecture 300. Some or all of the system components or data structures may also be stored (e.g., as instructions or structured data) on a non-transitory, computer accessible medium or a portable article to be read by an appropriate drive, various examples of which are described above. In some implementations, instructions stored on a computer-accessible medium separate from the computing architecture 300 may be transmitted to the computing architecture 300 via transmission media or signals such as electrical, electromagnetic, or digital signals, conveyed via a communication medium such as a wireless link. Various implementations may further include receiving, sending or storing instructions and/or data implemented in accordance with the foregoing description upon a computer-accessible medium.

The architectures, systems, and individual elements described herein may include many other logical, programmatic, and physical components, of which those shown in the accompanying figures are merely examples that are related to the discussion herein.

Figure 4:
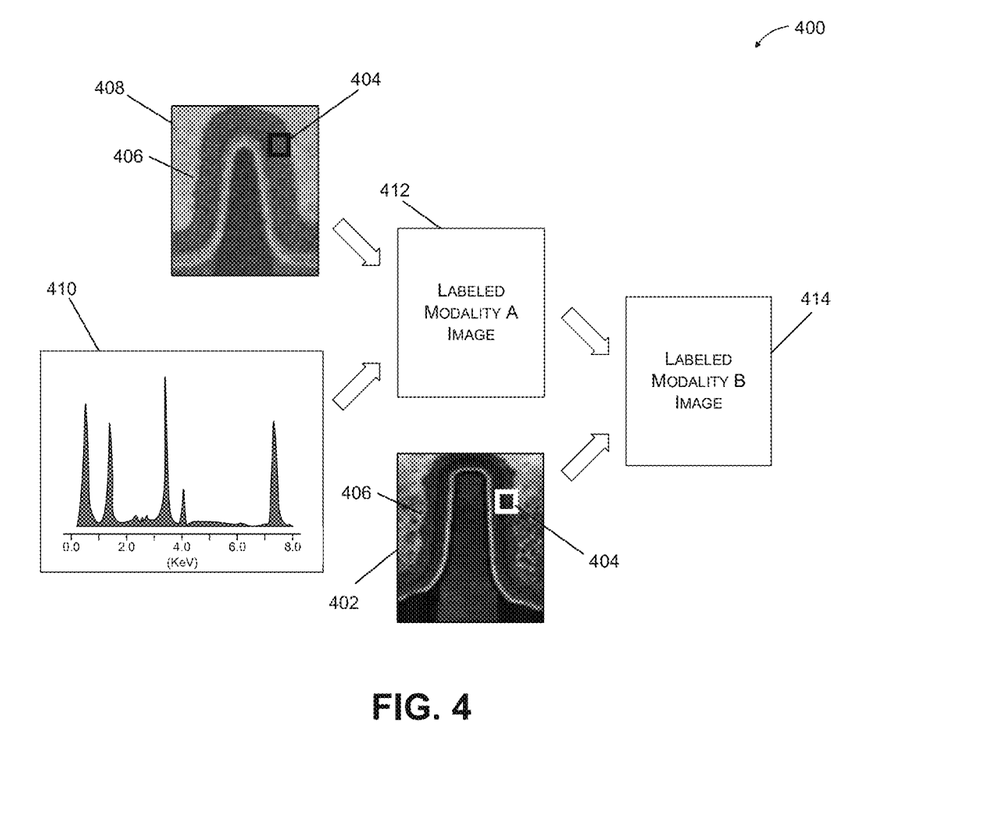
FIG. 4 depicts a sample process for automatically generating a labeled microscope image.

FIG. 4 is a diagram that illustrates a sample process 400 for automatically generating a labeled microscope image. FIG. 4 shows a first microscope image 402 that depicts the sample region 404 of the semiconductor sample 406. The first microscope image 402 is acquired using detector data from a primary microscope detector system of a EM and/or charged particle microscope. Generally, the primary microscope detector systems are configured to acquire highly detailed monochrome images of a sample. However, such primary microscope detector systems are not able to determine composition information about the sample. The sample region 404 is a region of the portion of the first microscope image 402 that a user would like to be labeled and/or segmented so that it includes composition information.

FIG. 4 also shows a second microscope image 408 that depicts the sample region 404 of a semiconductor sample 406. The second microscope image 408 is generated using detector data from a secondary microscope detector system that is of a different modality than the primary microscope detector. According to the present disclosure, the secondary microscope detector system may be a component element of the EM and/or charged particle microscope or may be a component element of a separate detection and/or imaging system.

FIG. 4 further illustrates a graph 410 that depicts composition information for the sample region 404 that is determined using the detector data from the secondary microscope detector system. Specifically, graph 410 depicts compositional information derived using x-ray dispersion analysis on detected x-ray data from a microscope dispersion x-ray detector system. By analyzing the peaks of the graph 410, a computing system can determine the compositional makeup of the sample region 404. Additionally, FIG. 4 shows the second microscope image 408 and the graph 410 being used to generate a labeled second image 412. That is, FIG. 4 illustrates how a secondary microscope detector system of a different modality than the primary microscope detector can be used to generate a labeled image. FIG. 4 also illustrates the first microscope image 402 and the labeled second image 412 being used to generate a second labeled image 414. In other words, FIG. 4 shows how labeled images acquired via a secondary microscope detector can be used to automatically label monochrome images acquired via a primary microscope detector.

Figure 5:
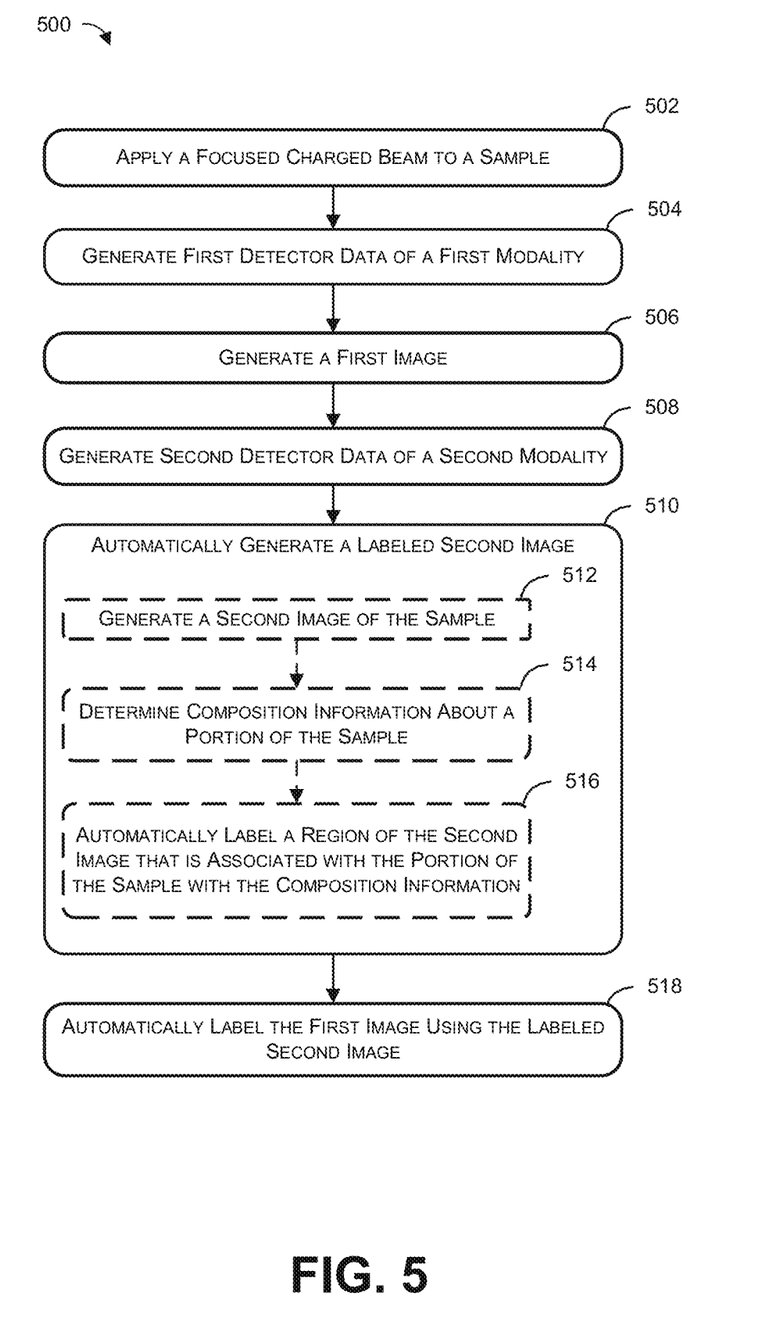
FIG. 5 is a flow diagram of an illustrative process for generating labeled images from a primary microscope detector system.
Figure 6:
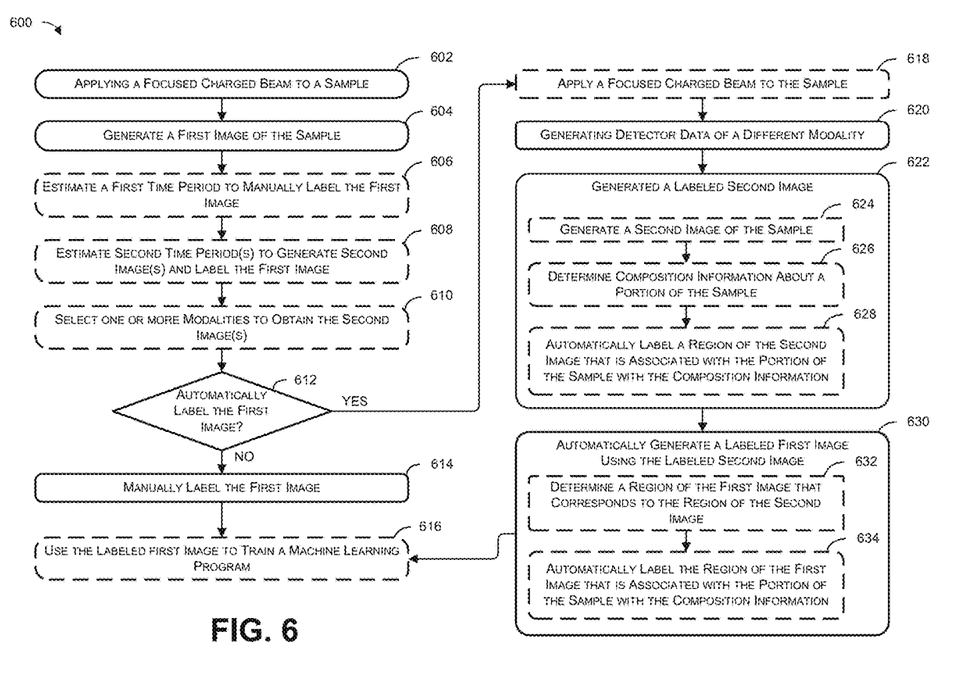
FIG. 6 is a flow diagram of an illustrative process for generating labeled images from a primary microscope detector system by leveraging detector data from a secondary microscope detector system of a different modality.

FIGS. 5 and 6 are flow diagrams of illustrative processes illustrated as a collection of blocks in a logical flow graph, which represent a sequence of operations that can be implemented in hardware, software, or a combination thereof. In the context of software, the blocks represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the processes.

FIG. 5 is a flow diagram of an illustrative process 500 for generating labeled images from a primary microscope detector system by leveraging detector data from a secondary microscope detector system of a different modality. The process 500 may be implemented in example EM and/or charged particle microscope setup(s) 100 and by the computing architecture 300 described above, or in other environments and architectures.

At 502, a focused charged beam is applied to a sample. Specifically, a focused charged beam of electrons and/or ions is directed onto a portion of the sample. For example, an EM microscope setup may include an electron source that generates and directs a beam of electrons along an emission axis towards a sample. Alternatively, or in addition, a charged particle microscope setup may include an ion source that generates and directs a beam of ions along an emission axis towards the sample.

At 504, first detector data of a first modality is generated. Specifically, a primary microscope detector system of a first modality is positioned to detect electrons, ions, photons, x-rays, etc. that are emitted by, reflected by, and/or transmitted through the sample as a result of the focused charged beam being incident on the sample. In various embodiments, the primary detector system may include a scanning electron microscope detector system, a dark field detector, a light field detector, a focused ion beam detector system, a scanning electron microscope secondary electron detector system, a focused ion beam secondary electron detector system, and an optical microscope detector system.

At 506, a first image is generated from the first detector data. For example, the computing device may be configured to select a color/gradient value for individual portions (i.e., pixels) of the first image based on the detector data received from the primary microscope detector system for corresponding of portions of the sample.

At 508, second detector data of a second modality that is different from the first modality is generated. Specifically, a secondary microscope detector system of the second modality is positioned to detect electrons, ions, photons, x-rays, etc. that are emitted by, reflected by, and/or transmitted through the sample as a result of the focused charged beam being incident on the sample. Alternatively, the secondary microscope detector system may be positioned to detect electrons, ions, photons, x-rays, etc. that are emitted by, reflected by, and/or transmitted through the sample as a result of a different focused charged beam being incident on the sample. The second detector data may be generated at the same time that the first detector data is generated, or it may be generated over a different time period. For example, a focused charged beam may be applied to the sample over a first period of time during which the first detector data is generated, and an electron beam is applied to the sample during a second period of time during which the second detector data is generated. In various embodiments, the secondary microscope detector system may correspond to one or more of a high angle dark field detector system, a dispersion x-ray detector system, a backscatter detector system, an electron energy loss spectroscopy detector system, a secondary ion detector system, and a secondary ion mass spectroscopy detector system.

At 510 a labeled second image is automatically generated. The labeled second image is an image of the sample or a portion thereof that is generated based on the second detector data of the second modality, and which includes information about the composition of what is depicted in the second image. Automatically generating the labeled second image may optionally include generating a second image of the sample at 512. For example, a computing device may automatically generate a second image of the sample based on the second detector data of the second modality received from the secondary microscope detector system. The computing device may be configured to select a color/gradient value for individual portions (i.e., pixels) of the second image of the sample based on the detector data of the second modality received from the secondary microscope detector system for the corresponding of portions of the sample.

In some embodiments, automatically generating the labeled second image may optionally further includes determining composition information about a portion of the sample at 510. For example, a computing device may generate composition information about one or more portions of the sample that the focused charged beam is incident upon. The composition information may be determined based on the second detector data of the second modality received from the secondary microscope detector system. For example, where the secondary microscope detector system is a dispersion X-ray detector, the computing device may determine compositional information of the portion of the sample by performing X-ray spectroscopy analysis on the second detector data.

Moreover, automatically generating the labeled second image may optionally further include automatically labeling a region of the second image that is associated with the portion of the sample with the composition information at 512. In various embodiments, labeling the second image may include tagging a portion of the second image, adding the compositional information to metadata associated with a portion of the second image, adding the compositional information to a data structure (i.e., table, file, etc.) for the second image, or a combination thereof.

A 518, the first image is automatically labeled using the labeled second image. For example, for a region of the first image that depicts a particular portion of the sample, the computing device can identify the region of the labeled second image that depicts the same portion of the sample, and then label that region of the first image with the compositional information from that portion of the labeled second image. The computing device can repeat this process to label additional regions and/or the entire first image. The computing device can determine the portions of the second image that correspond to the portions of the first image based on a pixel mapping, a machine learning algorithm that is trained using a training set of images generated by the primary microscope detector system and the secondary microscope detector system, the characteristics of the images, etc.

FIG. 6 is a flow diagram of an expanded illustrative process 600 for generating labeled images from a primary microscope detector system by leveraging detector data from a secondary microscope detector system of a different modality. The process 600 may be implemented in example EM and/or charged particle microscope setup(s) 100 and by the computing architecture 300 described above, or in other environments and architectures.

At 602, a focused charged beam is applied to a sample. Specifically, a focused charged beam of electrons and/or ions is directed onto a portion of the sample. For example, an EM microscope setup may include an electron source that generates and directs a beam of electrons along an emission axis towards a sample. Alternatively, or in addition, a charged particle microscope setup may include an ion source that generates and directs a beam of ions along an emission axis towards the sample.

At 604, a first image of the sample is generated. Specifically, a computing device may generate the first image based on first detector data generated by a primary microscope detector system. For example, the computing device may be configured to select a color/gradient value for individual portions (i.e., pixels) of the first image based on the detector data received from the primary microscope detector system for corresponding of portions of the sample. In various embodiments, the primary detector system may include a scanning electron microscope detector system, a dark field detector, a light field detector, a focused ion beam detector system, a scanning electron microscope secondary electron detector system, a focused ion beam secondary electron detector system, and an optical microscope detector system.

At 606 and 608, a first time period required to manually label the first image is optionally estimated, and a second time period required to generate a labeled second image and automatically label the first image is optionally estimated. At 610, one or more modalities to obtain the second images are optionally selected. For example, a computing device may determine to obtain the second images using the detector modalities that can generate the labeled second image in the shortest amount of time, with the greatest accuracy, or a combination thereof. The detector modalities may correspond to secondary detector systems of the same EM/charged particle microscope system as the primary microscope detector system, and/or detector systems of a separate imaging/detection systems.

At 612, it is determined whether to automatically label the first image. In some embodiments, it is determined whether to automatically label the first image based on whether it is more efficient than manually tagging the image. If the answer at 612 is no, the process continues to step 614, and the first image is manually labeled by a human operator. At 616, the labeled second image is optionally used to train a machine learning program. For example, the labeled second image may be added to a training set of EM images that are used to train deep learning algorithms to automatically analyze, label, and/or correct abnormalities in images obtained with electron microscopes (EM).

If the answer at 612 is yes, the process continues to step 618, and a focused charged beam is optionally applied to the sample. Specifically, another focused charged beam of electrons and/or ions is directed onto the portion of the sample. The focused charged beam may be of a different type (e.g., electron beam vs. ion beam), generated by a different source, or a combination thereof. Additionally, the focused charged beam may also be applied to the sample prior to, after, or contemporaneous with the application of the focused charged beam in step 602.

At 620, detector data of a different modality is generated. Specifically, a secondary microscope detector system of a different modality than the primary microscope system is positioned to detect electrons, ions, photons, x-rays, etc. that are emitted by, reflected by, and/or transmitted through the sample as a result of the focused charged beam being incident on the sample in step 602 or 618. In various embodiments, the secondary microscope detector system may correspond to one or more of a high angle dark field detector system, a dispersion x-ray detector system, a backscatter detector system, an electron energy loss spectroscopy detector system, a secondary ion detector system, and a secondary ion mass spectroscopy detector system.

At 622, a labeled second image is generated using the detector data from the secondary microscope detector system. The labeled second image is an image of the sample or a portion thereof that includes information about the composition of what is depicted in the second image. In some embodiments, a plurality of labeled images may be generated at 622, and then used to check and/or verify the accuracy of the composition information of the second image's labels. For example, a computing device may generate a labeled image based on detector data received from a secondary ion detector system, generate another labeled image based on detector data received from a high angle dark field detector, and then compare and/or check associated composition information for each portion of the sample depicted in the two labeled images. In this way, the computing device is able to verify the accuracy of the labeled second image. Where the compositional information cannot be verified the region of the image may be flagged for manual tagging.

Generating the labeled second image may optionally include generating a second image of the sample at 624. For example, a computing device may automatically generate the second image of the sample based on the detector data received from the secondary microscope detector system. Such a computing device may be configured to select a color/gradient value for individual portions (i.e., pixels) of the second image of the sample based on the detector data received from the secondary microscope detector system for the corresponding of portions of the sample.

In some embodiments, automatically generating the labeled second image may optionally further includes determining composition information about a portion of the sample at 626. For example, a computing device may generate composition information about one or more portions of the sample that the focused charged beam is incident upon. The composition information may be determined based on the detector data received from the secondary microscope detector system. For example, where the secondary microscope detector system is a dispersion X-ray detector, the computing device may determine compositional information of the portion of the sample by performing X-ray spectroscopy analysis on the detector data. Where the compositional information cannot be determined for a region of the image within a threshold confidence level, the region of the image may be flagged for manual tagging.

Moreover, automatically generating the labeled second image may optionally further includes automatically labeling a region of the second image that is associated with the portion of the sample with the composition information at 628. In various embodiments, labeling the second image may include tagging a portion of the second image, adding the compositional information to metadata associated with a portion of the image, adding the compositional information to a data structure (i.e., table, file, etc.) for the second image, or a combination thereof.

At 630, a labeled first image is automatically generated using the labeled second image. For example, for a region of the second image that depicts a particular portion of the sample, the computing device can identify the region of the first image that depicts the same portion of the sample, and then label that region of the first image with the compositional information from that portion of the labeled second image. Generating the labeled first image optionally includes determining a region of the first image that corresponds to a region of the second image at 632. In some embodiments, the computing device may receive a user selection of the region of the first image that is to be labeled and/or segmented using the labeled second image. The user selection may be input via a keyboard, mouse, touchpad, touchscreen, etc. For example, the computing device may display the first image, and provide functionality to identify regions of the first image that are to be automatically labeled. The computing device can determine the portions of the second image that correspond to the portions of the first image based on a pixel mapping, a machine learning algorithm that is trained using a training set of images generated by the primary microscope detector system and the secondary microscope detector system, the characteristics of the images, etc.

In some embodiments, generating the labeled first image further optionally includes automatically labeling the region of the first image that is associated with the portion of the sample with the composition information at 634. The computing device can repeat the process steps 632 and 634 to label additional regions and/or the entire first image. The process then moves to step 616, where the labeled first image is optionally used to train a machine learning program.

Examples of inventive subject matter according to the present disclosure are described in the following enumerated paragraphs.

A1. A method for generating labeled images from a microscope detector of a first modality of by leveraging detector data from a different microscope detector of a different modality: applying a focused charged beam to a sample; generating, using an X-ray detector system and based on emissions resultant from the focused charged beam being incident on the sample, X-ray detector data; automatically generating, by one or more processors of a computing device, a first labeled image based on the X-ray detector data, wherein the automatically generating the first labeled image comprises: generating, by the one or more processors and based on the X-ray detector data, a first image of the sample; determining, by the one or more processors based on the X-ray detector data and using energy dispersive X-ray spectroscopy, composition information about a portion of the sample; and automatically labeling, by the one or more processors, a region of the first image that is associated with the portion of the sample with the composition information; generating, based on the emissions resultant from the focused charged beam being incident on the sample, a second image using a microscope detector system, wherein the microscope detector system is of a different modality than the X-ray detector system; and automatically labeling, by the one or more processors and based on the second image and the first image, a region of the second image associated with the portion of the sample with the composition information.

A2. The method of paragraph A1, wherein the microscope detector system is one of: a scanning electron microscope detector system; a focused ion beam detector system; a scanning electron microscope secondary electron detector system; a focused ion beam secondary electron detector system; a scanning transmission electron microscopy bright field detector system; and an optical microscope detector system.

A3. The method of any of paragraphs A1-A2, wherein automatically labeling the region of the second image associated with the portion of the sample with the composition information comprises determining a first pixel location of the region of the first image, determining a second pixel location of the second image that corresponds to the first pixel location, and labeling the second pixel location of the second image with the composition information.

A3.1. The method of paragraph A3, wherein the determining that the second pixel location of the second image corresponds to the first pixel location is based on a pixel mapping between images generated from the X-ray detector system and images generated from the microscope detector system.

A3.1.1. The method of paragraph A3.1, wherein the mapping was generated by a machine learning program trained using a training set of labeled images, the training set of labeled images comprising a plurality of images generated using the X-ray detector system, wherein for each image generated using the X-ray detector system the training set of labeled images includes a corresponding image of a same sample generated using the microscope detector system.

A3.2. The method of paragraph A3, wherein determining the second pixel location of the second image that corresponds to the first pixel location comprises: identifying one or more image characteristics of the first pixel location; and identifying one or more locations in the second image that have at least one image characteristic similar to the one or more image characteristics.

A3.2.1. The method of paragraph A3.2, wherein the one or more image characteristics and/or the at least one image characteristic includes: an edge; a line; a shape; a contrast change; proximity to the edge; proximity to the line; proximity to the shape; proximity to the contrast change.

A3.3. The method of any of paragraphs A3-A3.2.1, wherein automatically the region of the second image associated with the portion of the sample with the composition information further comprises applying an algorithm that accounts for distortion in one of the X-ray detector system and the microscope detector system.

B1. A method for generating labeled images from a microscope detector by leveraging detector data from a different microscope detector of a different modality:

applying a focused charged beam to a sample;

generating, using a first microscope detector system of a first modality and based on emissions resultant from the focused charged beam being incident on the sample, first detector data of the first modality;

automatically generating, by one or more processors of a computing device, a first labeled image based on the first detector data of the first modality, wherein the automatically generating the first labeled image comprises:

generating, by the one or more processors and based on the first detector data, a first image of the sample;

determining, by the one or more processors and based on the first detector data, composition information about a portion of the sample; and automatically labeling, by the one or more processors, a region of the first image that is associated with the portion of the sample with the composition information;

generate, based on the emissions resultant from the focused charged beam being incident on the sample, a second image using a second microscope detector system of a second modality, wherein the second modality is different from the first modality; and automatically labeling, by the one or more processors and based on the second detector data and the first labeled image, a region of the second image associated with the portion of the sample with the composition information.

B2. The method of paragraph B1, wherein the first microscope detector system of the first modality is one of: a scanning electron microscope high angle dark field detector system; a scanning transmission electron microscope energy dispersion x-ray detector system; a scanning electron microscope back scatter detector system; a scanning electron microscope energy dispersion x-ray detector system; a scanning transmission electron microscope electron energy loss spectroscopy detector system; a focused ion beam secondary ion detector system; and a focused ion beam secondary ion mass spectroscopy detector system.

B3. The method of any of paragraphs B1-B2, wherein the second microscope detector system of the second modality is one of: a scanning electron microscope detector system; a focused ion beam detector system; a scanning electron microscope secondary electron detector system; a focused ion beam secondary electron detector system; a scanning transmission electron microscopy bright field detector system; and an optical microscope detector system.

B4. The method of any of paragraphs B1-B3, wherein automatically labeling the region of the second image associated with the portion of the sample with the composition information comprises determining a first pixel location of the region of the first image, determining a second pixel location of the second image that corresponds to the first pixel location, and labeling the second pixel location of the second image with the composition information.

B4.1. The method of paragraph B4, wherein the determining that the second pixel location of the second image corresponds to the first pixel location is based on a pixel mapping between images generated from the first microscope detector system and images generated from the second microscope detector system.

B4.1.1. The method of paragraph B4.1, wherein the mapping was generated by a machine learning program trained using a training set of labeled images, the training set of labeled images comprising a plurality of images generated using the first microscope detector system, wherein for each image generated using the first microscope detector system the training set of labeled images includes a corresponding image of a same sample generated using the second microscope detector system.

B4.2. The method of paragraph B4, wherein determining the second pixel location of the second image that corresponds to the first pixel location comprises: identifying one or more image characteristics of the first pixel location; and identifying one or more locations in the second image that have at least one image characteristic similar to the one or more image characteristics.

B4.2.1. The method of paragraph B4.2, wherein the one or more image characteristics and/or the at least one image characteristic includes: an edge; a line; a shape; a contrast change; proximity to the edge; proximity to the line; proximity to the shape; and proximity to the contrast change.

B4.3. The method of any of paragraphs B4-B4.2.1, wherein automatically labeling the region of the second image associated with the portion of the sample with the composition information further comprises applying an algorithm that accounts for distortion in one of the first microscope detector system and the second microscope detector system.

B4.4. The method of any of paragraphs B4-B4.3, wherein the first pixel location of the region of the first image and/or the second pixel location of the second image is an individual pixel.

B4.5. The method of any of paragraphs B4-B4.3, wherein the first pixel location of the region of the first image and/or the second pixel location of the second image is a plurality of pixels.

B5. The method of any of paragraphs B1-B4.3, wherein applying the focused charged beam to the sample comprises: applying the focused charged beam to the sample over a first time period, wherein the first detector data of the first modality is generated based on the emissions resultant from the focused charged beam being incident on the sample during the first time period; and applying the focused charged beam to the sample over a second time period that is different than the first time period, wherein the second detector data of the second modality is generated based on additional emissions resultant from the focused charged beam being incident on the sample during the second time period.

B5.1. The method of paragraph B5, wherein the first time period is prior to the second time period.

B5.2. The method of paragraph B5, wherein the second time period is prior to the first time period.

B6. The method of any of paragraphs B1-B4.3, wherein applying the focused charged beam to the sample comprises: applying the focused charged beam to the portion of the sample over a first time period; and applying the focused charged beam to an additional portion of the sample over a second time period that is different than the first time period.

B6.1. The method of paragraph B6, wherein the first detector data of the first modality and the second detector data of the second modality is generated based on emissions resultant from the focused charged beam being incident on the portion of the sample during the first time period.

B6.2. The method of any of paragraphs B6-B6.1, further comprising: generating, using the first microscope detector system of the first modality and based on additional emissions resultant from the focused charged beam being incident on the additional portion of the sample over the second time period, third detector data of the first modality; determining, by the one or more processors and based on the third detector data, additional composition information about the additional portion of the sample; and automatically labeling, by the one or more processors, an additional region of the second image associated with the additional portion of the sample with the additional composition information.

B7. The method of any of paragraphs B1-B7.2, wherein applying the focused charged beam to the sample comprises applying the focused charged beam to the portion of the sample.

B8. The method of any of paragraphs B1-B7, wherein determining the first image of the sample comprises: determining, based on the first detector data, a color value associated with the portion of the sample; and generating the first image, wherein the region of the first image associated with the portion of the sample has the color value.

B9. The method of paragraphs B1-B8, further comprising: generating, using a third microscope detector system of a third modality and based on the emissions resultant from the focused charged beam being incident on the sample, third detector data of the third modality; automatically generating, by the one or more processors, a third labeled image based on the third detector data of the third modality, wherein the generating the third labeled image comprises: generating, by the one or more processors and based on the third detector data, a third image of the sample; and determining, by the one or more processors and based on the third detector data, additional composition information about the portion of the sample.

B9.1. The method of paragraph B9, wherein automatically labeling the region of the second image associated with the portion of the sample comprises: determining that the composition information matches the additional composition information; and labeling the region of the second image associated with the portion of the sample with the composition information based on the composition information matching the additional composition information.

B9.2. The method of paragraph B9, wherein automatically labeling the region of the second image associated with the portion of the sample comprises: determining that the composition information does not match the additional composition information; and flagging the region of the second labeled image associated with the portion of the sample as needing user input based on the composition information not matching the additional composition information.

B10. The method of paragraphs B1-B9.2, further comprising: estimating a first time to label the second image using machine learning; estimating a second time to: generate the first image; label the first image; and leverage the first image to label the second image; and determining to execute the method of paragraphs B1-B9.2 based on the first time being greater than the second time.

B11. The method of any of paragraphs B1-B10, further comprising: estimating a first time to: generate the first image; label the first image; and leverage the first image to label the second image; estimating a second time to: generate a third image using a third microscope detector system of a third modality; label the third image using thirds detector data of the third modality; and leverage the third image to label the second image; and determining to execute the method of paragraphs B1-B10 based on the first time being less than the second time.

C1. A system for generating labeled images from a microscope detector of a first modality of by leveraging detector data from a microscope detector of a different modality, the system comprising: a platform configured to support a sample; a focused charged beam source configured to apply a focused charged beam to the sample; an X-ray detector system; a microscope detector system of a different modality than the X-ray detector system; one or more processors; and memory storing non-transitory computer readable instructions that, when executed by the one or more processors, cause the one or more processors to perform the method of any of paragraphs A1-A3.3.

C2. The method of paragraph C1, wherein the microscope detector system is one of: a scanning electron microscope detector system; a focused ion beam detector system; a scanning electron microscope secondary electron detector system; a focused ion beam secondary electron detector system; a scanning transmission electron microscopy bright field detector system; and an optical microscope detector system.

D1. A system for generating labeled images from a microscope detector of a first modality of by leveraging detector data from a microscope detector of a different modality, the system comprising: a platform configured to support a sample; a focused charged beam source configured to apply a focused charged beam to the sample; a first microscope detector system of the first modality; a second microscope detector system of the second modality than the first modality; one or more processors; and memory storing non-transitory computer readable instructions that, when executed by the one or more processors, cause the one or more processors to perform the method of any of paragraphs B1-B11.

D2. The method of paragraph D1, wherein the first microscope detector system of the first modality is one of: a scanning electron microscope high angle dark field detector system; a scanning transmission electron microscope energy dispersion x-ray detector system; a scanning electron microscope back scatter detector system; a scanning electron microscope energy dispersion x-ray detector system; a scanning transmission electron microscope electron energy loss spectroscopy detector system; a focused ion beam secondary ion detector system; and a focused ion beam secondary ion mass spectroscopy detector system.

D3. The method of any of paragraphs D1-D2, wherein the second microscope detector system of the second modality is one of: a scanning electron microscope detector system; a focused ion beam detector system; a scanning electron microscope secondary electron detector system; a focused ion beam secondary electron detector system; a scanning transmission electron microscopy bright field detector system; and an optical microscope detector system.

E1. Use of the system of any of paragraphs C1-C2 and D1-D3 to perform the method of any of paragraphs A1-A3.3 and B1-B11.

F1. A non-transitory computer readable media that stores instructions that, when executed by a processor, causes the processor to initiate the performance of the method of any of paragraphs A1-A3.3 and B1-B11.

G1. Use of the non-transitory computer readable media of paragraph F1 to perform the method of any of paragraphs A1-A3.3 and B1-B11.

What is claimed is:

1. A method for generating labeled images from a microscope detector of a first modality by leveraging detector data from a different microscope detector of a different modality:
   applying a focused charged beam to a sample;
   generating, using an X-ray detector system and based on emissions resultant from the focused charged beam being incident on the sample, X-ray detector data;
   automatically generating, by one or more processors of a computing device, a labeled first image based on the X-ray detector data, the labeled first image including composition information about at least a portion of the sample, wherein the automatically generating the labeled first image comprises:
      generating, by the one or more processors and based on the X-ray detector data, a first image of the sample;
      determining, by the one or more processors based on the X-ray detector data and using energy dispersive X-ray spectroscopy, composition information about a portion of the sample; and
      automatically labeling, by the one or more processors, a region of the first image that is associated with the portion of the sample with the composition information;
   generating, based on the emissions resultant from the focused charged beam being incident on the sample, a second image using a microscope detector system, wherein the microscope detector system is of a different modality than the X-ray detector system; and
   automatically labeling, by the one or more processors and based on the second image and the first image, a region of the second image associated with the portion of the sample with the composition information from the labeled first image.

2. The method claim 1, wherein automatically labeling the region of the second image associated with the portion of the sample with the composition information comprises determining a first pixel location of the region of the first image, determining a second pixel location of the second image that corresponds to the first pixel location, and labeling the second pixel location of the second image with the composition information.

3. A system for generating labeled images from a microscope detector of a first modality by leveraging detector data from a microscope detector of a different modality, the system comprising:
   a platform configured to support the sample;
   a focused charged beam source configured to apply a focused charged beam to the sample;
   the X-ray detector system;
   the microscope detector system of a different modality than the X-ray detector system;
   the one or more processors; and
   memory storing non-transitory computer readable instructions that, when executed by the one or more processors, cause the one or more processors to perform the method of claim 1.

4. A method for generating labeled images from a microscope detector by leveraging detector data from a different microscope detector of a different modality:
   applying a focused charged beam to a sample;
   generating, using a first microscope detector system of a first modality and based on emissions resultant from the focused charged beam being incident on the sample, first detector data of the first modality;
   automatically generating, by one or more processors of a computing device, a labeled first image based on the first detector data of the first modality, the labeled first image including composition information about a portion of the sample;
   generating, based on the emissions resultant from the focused charged beam being incident on the sample, a second image of the sample using second detector data from a second microscope detector system of a second modality, wherein the second modality is different from the first modality; and
   automatically labeling, by the one or more processors and based on the second detector data and the labeled first image, a region of the second image associated with the portion of the sample with the composition information from the labeled first image.

5. The method of claim 4, wherein the first microscope detector system of the first modality is one of:
   a scanning electron microscope high angle dark field detector system;
   a scanning transmission electron microscope energy dispersion x-ray detector system;
   a scanning electron microscope back scatter detector system;
   a scanning electron microscope energy dispersion x-ray detector system;
   a scanning transmission electron microscope electron energy loss spectroscopy detector system;
   a focused ion beam secondary ion detector system; and
   a focused ion beam secondary ion mass spectroscopy detector system.

6. The method of claim 4, wherein the second microscope detector system of the second modality is one of:
   a scanning electron microscope detector system;
   a focused ion beam detector system;
   a scanning electron microscope secondary electron detector system;
   a focused ion beam secondary electron detector system;
   a scanning transmission electron microscopy bright field detector system; and
   an optical microscope detector system.

7. The method of claim 4, wherein the automatically generating the labeled first image comprises:

generating, by the one or more processors and based on the first detector data, a first image of the sample;

determining, by the one or more processors and based on the first detector data, the composition information about the portion of the sample; and automatically labeling, by the one or more processors, a region of the first image that is associated with the portion of the sample with the composition information.

8. The method of claim 7, wherein automatically labeling the region of the second image associated with the portion of the sample with the composition information comprises determining a first pixel location of the region of the first image, determining a second pixel location of the second image that corresponds to the first pixel location, and labeling the second pixel location of the second image with the composition information.

9. The method of claim 8, wherein the first pixel location of the region of the first image and/or the second pixel location of the second image is a plurality of pixels.

10. The method of claim 8, wherein the determining that the second pixel location of the second image corresponds to the first pixel location is based on a pixel mapping between images generated from the first microscope detector system and images generated from the second microscope detector system.

11. The method of claim 8, wherein determining the second pixel location of the second image that corresponds to the first pixel location comprises:

identifying one or more image characteristics of the first pixel location; and identifying one or more locations in the second image that have at least one image characteristic similar to the one or more image characteristics.

12. The method of claim 11, wherein the one or more image characteristics and/or the at least one image characteristic includes:

an edge;
a line;
a shape;
a contrast change;
proximity to the edge;
proximity to the line;
proximity to the shape; and
proximity to the contrast change.

13. The method of claim 4, wherein applying the focused charged beam to the sample comprises:

applying the focused charged beam to the sample over a first time period, wherein the first detector data of the first modality is generated based on the emissions resultant from the focused charged beam being incident on the sample during the first time period; and applying the focused charged beam to the sample over a second time period that is different than the first time period, wherein the second detector data of the second modality is generated based on additional emissions resultant from the focused charged beam being incident on the sample during the second time period.

14. The method of claim 4, further comprising:

generating, using a third microscope detector system of a third modality and based on the emissions resultant from the focused charged beam being incident on the sample, third detector data of the third modality;

automatically generating, by the one or more processors, a third labeled image based on the third detector data of the third modality, wherein the generating the third labeled image comprises:

generating, by the one or more processors and based on the third detector data, a third image of the sample; and determining, by the one or more processors and based on the third detector data, additional composition information about the portion of the sample.

15. The method of claim 14, wherein automatically labeling the region of the second image associated with the portion of the sample comprises:

determining that the composition information matches the additional composition information; and labeling the region of the second image associated with the portion of the sample with the composition information based on the composition information matching the additional composition information.

16. A system for generating labeled images from a microscope detector of a first modality of by leveraging detector data from a microscope detector of a different modality, the system comprising:

a platform configured to support the sample;
a focused charged beam source configured to apply the focused charged beam to the sample;
the first microscope detector system of the first modality;
the second microscope detector system of the second modality than the first modality;
the one or more processors; and
memory storing non-transitory computer readable instructions that, when executed by the one or more processors, cause the one or more processors to perform the method of claim 5.

17. A computer readable media storing non-transitory computer readable instructions that, when executed by one or more processors of a computing device, cause the computing device to:

receive first detector data of a first modality from a first microscope detector system and based on emissions resultant from a focused charged beam being incident on a sample;

automatically generate a labeled first image based on the first detector data of the first modality, the labeled first image including composition information about at least a portion of the sample;

receive second detector data of a second modality from a second microscope detector system and based on the emissions resultant from the focused charged beam being incident on the sample, wherein the second modality is different from the first modality;

generate a second image of the sample using the second detector data; and automatically label, based on the labeled first image, a region of the second image associated with the portion of the sample with the composition information.

18. The computer readable media of claim 17, wherein automatically generating the labeled first image comprises:

generating, based on the first detector data, a first image of the sample;

determining, based on the first detector data, composition information about a portion of the sample; and automatically labeling a region of the first image that is associated with the portion of the sample with the composition information.

19. The computer readable media of claim 18, wherein automatically labeling the region of the second image associated with the portion of the sample with the composition information comprises determining a first pixel location of the region of the first image, determining a second pixel location of the second image that corresponds to the first pixel location, and labeling the second pixel location of the second image with the composition information.

20. The computer readable media of claim 17, wherein the second microscope detector system is a component detector of a charged particle system for generating images of the sample, and the first microscope detector system is a component detector of a system that is separate from the charged particle system for generating images of the sample.

* * * * *